US006828259B2

(12) United States Patent
Fisher et al.

(10) Patent No.: US 6,828,259 B2
(45) Date of Patent: Dec. 7, 2004

(54) ENHANCED TRANSISTOR GATE USING E-BEAM RADIATION

(75) Inventors: Philip A. Fisher, Foster City, CA (US); Chih-Yuh Yang, San Jose, CA (US); Marina V. Plat, San Jose, CA (US); Russell R.A. Callahan, San Jose, CA (US); Ashok M. Khathuria, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 69 days.

(21) Appl. No.: 10/017,855

(22) Filed: Dec. 14, 2001

(65) Prior Publication Data

US 2004/0209411 A1 Oct. 21, 2004

Related U.S. Application Data

(63) Continuation-in-part of application No. 09/819,344, filed on Mar. 28, 2001, now Pat. No. 6,653,231, and a continuation-in-part of application No. 09/819,692, filed on Mar. 28, 2001, now Pat. No. 6,589,709, and a continuation-in-part of application No. 09/819,342, filed on Mar. 28, 2001, now Pat. No. 6,630,288.

(51) Int. Cl.[7] .......................... H01L 21/26; H01L 21/42
(52) U.S. Cl. ..................... 438/795; 438/671; 438/720; 438/723; 438/719; 430/328; 430/313; 430/296
(58) Field of Search ................................ 438/671, 723, 438/371, 719, 720, 795; 430/328, 313, 296

(56) References Cited

U.S. PATENT DOCUMENTS

| 3,997,367 A | 12/1976 | Yau ............................. 438/371 |
| 4,394,211 A | 7/1983 | Uchiyama et al. .......... 438/623 |
| 4,446,222 A | 5/1984 | Kress ......................... 430/307 |

(List continued on next page.)

OTHER PUBLICATIONS

Chiong et al., "Resist contrast enhancement in high resolution electron beam lithography," Journal of Vacuum Science & Technology, vol. 7, No. 6, Nov. 1989, pp. 1771–1777 (8 pgs).

Lee et al., "Fabrication of 0.06 μm Poly–Si Gate Using DUV Lithography with a Designed $Si_x O_y N_z$ Film as an Arc and Hardmask," Symposium on VLSI Technology Digest of Technical Papers, 1997, pp. 131–132 (2 pgs.).

D. W. Hess and D. B. Graves, "Plasma–Enhanced Etching and Deposition," Microelectronics Processing, (Eds.: D. W. Hess & K. F. Jensen) ACS (1989), Ch. 8 pp. 337–440 (34 pgs.).

Yang et al., "Electronic Beam Processing for Spin–on Polymers and its Applications to Back–End–of–Line (BEOL) Integration," materials Research Society Symposium Proceedings, vol. 511, Apr. 1998 (7 pgs.).

PCT International Search Report for PCT/US02/05640 dated Oct. 2, 2002 (7 pgs.).

International Preliminary Examination Report for PCT/US02/05640 dated Jul. 3, 2003 (8 pgs.).

U.S. patent application Ser. No. 09/819,342, Shields et al., filed Mar. 28, 2001.

(List continued on next page.)

*Primary Examiner*—George Fourson
*Assistant Examiner*—Julio J. Maldonado
(74) *Attorney, Agent, or Firm*—Foley & Lardner LLP

(57) ABSTRACT

A process for forming a transistor having a gate width of less than 70 nm is disclosed herein. The process includes E-beam irradiation a gate patterned on a photoresist layer, trimming the gate patterned on the photoresist layer, and etching the gate patterned on the photoresist layer to a polysilicon layer disposed below the photoresist layer.

20 Claims, 5 Drawing Sheets

U.S. PATENT DOCUMENTS

| | | | | |
|---|---|---|---|---|
| 5,003,178 A | | 3/1991 | Livesay | 250/492.3 |
| 5,139,904 A | * | 8/1992 | Auda et al. | 430/30 |
| 5,468,595 A | | 11/1995 | Livesay | 430/296 |
| 5,658,469 A | | 8/1997 | Jennison | 428/611 |
| 5,876,903 A | | 3/1999 | Ng et al. | 430/313 |
| 5,962,195 A | | 10/1999 | Yen et al. | 430/316 |
| 5,965,461 A | | 10/1999 | Yang et al. | 438/717 |
| 5,994,225 A | | 11/1999 | Liu et al. | 438/694 |
| 6,057,066 A | | 5/2000 | Hanawa | 430/5 |
| 6,103,457 A | | 8/2000 | Gabriel | 430/318 |
| 6,107,172 A | | 8/2000 | Yang et al. | 438/585 |
| 6,110,837 A | | 8/2000 | Linliu et al. | 438/723 |
| 6,174,818 B1 | | 1/2001 | Tao et al. | 438/733 |
| 6,183,937 B1 | * | 2/2001 | Tsai et al. | 430/313 |
| 6,197,687 B1 | | 3/2001 | Buynoski | 438/671 |
| 6,200,903 B1 | | 3/2001 | Oh et al. | 438/705 |
| 6,232,048 B1 | | 5/2001 | Buynoski et al. | 430/328 |
| 6,319,655 B1 | | 11/2001 | Wong et al. | 430/311 |
| 6,358,670 B1 | | 3/2002 | Wong et al. | 430/296 |
| 6,395,447 B1 | | 5/2002 | Ishii et al. | 430/191 |
| 6,420,097 B1 | | 7/2002 | Pike et al. | 430/313 |

OTHER PUBLICATIONS

U.S. patent application Ser. No. 09/819,343, Gabriel et al., filed Mar. 28, 2001.

U.S. patent application Ser. No. 09/819,344, Okoroanyanwu et al., filed Mar. 28, 2001.

U.S. patent application Ser. No. 09/819,552, Gabriel et al., filed Mar. 28, 2001.

U.S. patent application Ser. No. 09/819,692, Okoroanyanwu et al., filed Mar. 28, 2001.

U.S. patent application Ser. No. 09/8820,143, Okoroanyanwu et al., filed Mar. 28, 2001.

Livesay. W. R., "*Large–area electron–beam source,*" Journal of Vacuum Science & Technology B. vol. 11, No. 6, Nov./Dec. 1993, pp. 2304–2308, American Vacuum Society.

Yank, J. J. et al, "*Electron Beam Processing for Spin–on Polymers and its Applications to Back–End–of–Line (BEOL) Integration,*" Materials Research Society Symposium Proceedings, vol. 511, 1998, pp. 49–55, Materials Research Society.

Ross et al "*Plasma Etch Characteristics of Electron Beam Processed Photoresist,.*" The Society of Photo–Optical Instrumentation Engineers, vol. 2438, 1995, pp. 803–816. SPIE–The International Society for Optical Engineering.

Grün, Von A.E., *Lumineszenz–photometrische Mesungen der Energieabsorption int Strahlungsfeld von Elektronenquetlen Eindimensionaler Fall in Luff*. Zeitschrift für Naturforschung: vol. 12a. 1957, pp. 89–95. Publisher: Zeitschrift für Naturforschung: full English Translation attached (11 pgs.).

* cited by examiner

ENHANCED TRANSISTOR GATE USING E-BEAM RADIATION

CROSS REFERENCE TO RELATED APPLICATIONS

The present application is a continuation-in-part of U.S. patent application Ser. No. 09/819,344 filed Mar. 28, 2001 now U.S. Pat. No. 6,653,231 by Okoroanyanwu. et al. entitled "Process for Reducing the Critical Dimensions of Integrated Circuit Device Features" U.S. patent application Ser. No. 09/819,692 filed Mar. 28, 2001 now U.S. Pat. No. 6,589,709 by Okoroanyanwu et al., entitled "Process for Preventing Deformation of Patterned Photoresist Features;" and U.S. patent application Ser. No. 09/819,342 filed Mar. 28, 2001 now U.S. Pat. No. 6,630,288 by Okoroanyanwu et al., entitled "Process for Forming Sub-lithographic Photoresist Features by Modification of the Photoresist Surface." The present application is also related to U.S. patent application Ser. No. 09/820,143 by Okoroanyanwu et al., entitled "Improving SEM Inspection and Analysis of Patterned Photoresist Features;" U.S. patent application Ser. No. 09/819, 343 by Gabriel et al., entitled "Selective Photoresist Hardening to Facilitate Lateral Trimming;" and U.S. patent application Ser. No. 09/819,552 by Gabriel et al., entitled "Process for Improving the Etch Stability of Ultra-Thin Photoresist." All of the above application were filed on Mar. 28, 2001 and are assigned to the Assignee of the present application.

FIELD OF THE INVENTION

The present invention relates generally to integrated circuit (IC) fabrication. More particularly, the present invention relates to fabrication of transistors having uniform gate widths, reduced gate widths, and preserved minimum extension of the gates onto the field isolation region.

BACKGROUND OF THE INVENTION

The semiconductor or integrated circuit (IC) industry aims to manufacture ICs with higher and higher densities of devices on a smaller chip area to achieve greater functionality and to reduce manufacturing costs. This desire for large scale integration requires continued shrinking of circuit dimensions and device features. The ability to reduce the size of structures, such as, gate lengths and widths in field-effect transistors or the width of conductive lines, is driven by the performance of lithographic tools (e.g., wavelength of the exposure sources), resolution enhancement techniques (e.g., phase shifting masks, off-axis illumination, etc.), and photoresist materials (collectively referred to as lithographic techniques).

However, currently available lithographic techniques lack the resolution to print sufficiently small IC device features. Thus, various non-lithographic techniques are also employed to shrink or reduce feature dimensions after lithographic printing. One such non-lithographic technique is a resist trimming process that reduces or "trims" features patterned on a photoresist layer of a semiconductor wafer before such features are transferred to the underlying layer (s) of the semiconductor wafer. The resist trimming process utilizes a plasma etch to remove the desired amount of the patterned photoresist material. As an example, a feature patterned on a polystyrene-based photoresist material typically employed for wafer patterning using a 248 nm wavelength of light lithography process can initially have a dimension on the order of 150 nm and be plasma trimmed to a dimension of approximately 100 nm or less.

In contrast, it is difficult for features patterned on an acrylic, cycloacrilate and cycloolephine polymer-based photoresist material typically employed in lithography processes using 193 nm wavelength of light to realize a similar amount of dimensional reduction from a resist trimming process.

Present photoresist material used for 193 nm lithography exhibits poor trimming properties, suffering from, among other problems, high vertical resist erosion rate (Rv), low horizontal trim rate (Rh), a high rate of erosion of the ends of lines (Re). When attempting to trim resist to the small gate dimensions required for modern VLSI transistors, it is quite common for the vertical erosion rate to completely consume portions of the resist pattern before the desired in-plane dimensions have been reached, resulting in damaged or discontinuous transistor gates or gates exhibiting an unacceptably high and variable series resistance.

A typical resist material used in 193 nm lithography exhibits poor trimming properties, suffering from, among others, uncontrollable and different trim rates in the horizontal and vertical directions. It is not uncommon for features patterned on 193 nm photoresist materials to become deformed and/or consumed in the course of the resist trimming process, thereby preventing subsequent processes from commencing.

For example, transistor gates patterned using 193 nm lithography and a typical commercially available photoresist material can have critical dimensions (CDs) of 130–110 nm before the resist trimming process and the final critical dimensions (CDs) of approximately 70–80 nm after the resist trimming process. Any further trimming would typically result in non-uniform widths along the length of the gates, unacceptable consumption of the minimum extension of the gates onto the field isolation regions, (i.e. unacceptably large end of the line pull back) and/or excessive thinning of the gate pattern over topography steps such that pattern transfer to the underlying layer(s) of the wafer is not possible. Such poor trimming results can affect the operating conditions and/or performance of the transistors to the extent that the resist trimming process will become unusable without violating design rules for given technology scaling requirements.

Thus, there is a need for a process for enhancing the resist trimmability during etch and resist stability during etch to enable the successful transfer of transistor gates patterned on photoresist materials. There is a further need for a process of fabricating transistor gates having smaller critical dimensions, uniform widths along its length, and/or preserved minimum extension of the gates onto the field isolation regions than is possible with conventional photolithography and resist trimming process.

SUMMARY OF THE INVENTION

One embodiment of the invention relates to an integrated circuit fabrication process. The process includes patterning a transistor gate pattern on a photoresist layer, and curing the transistor gate pattern with an electron beam. The process further includes trimming the cured transistor gate pattern, and transferring the trimmed transistor gate pattern to a layer disposed below the photoresist layer to form a transistor gate. The transistor gate includes a width and a length. A variation of the width along the length of the transistor gate is reduced due to the curing step.

Another embodiment of the invention relates to a method of forming a transistor having a gate width of less than 70 nm. The method includes E-beam irradiation of a gate pattern of a photoresist layer, and trimming the E-beam irradiated gate pattern of the photoresist layer. The method further includes etching a polysilicon layer disposed below the photoresist layer in accordance with the trimmed gate pattern to form a gate of the transistor. The gate width is preferably less than 70 nm.

Still another embodiment of the invention relates to an integrated circuit. The integrated circuit includes an isolation region and a transistor surrounded by the isolation region. The transistor includes a gate. A critical dimension of the gate is less than approximately 60 nm. The gate is defined by an E-beam irradiated gate feature on a photoresist layer and trimming the E-beam radiation irradiated gate pattern of the photoresist layer, while preserving the gate to isolation line extension to ensure enhanced transistor performance.

BRIEF DESCRIPTION OF THE DRAWINGS

The exemplary embodiments will become more fully understood from the following detailed description, taken in conjunction with the accompanying drawings, wherein like reference numerals denote like elements, in which.

DETAILED DESCRIPTION OF THE PREFERRED EMBODIMENTS

Figure 1:
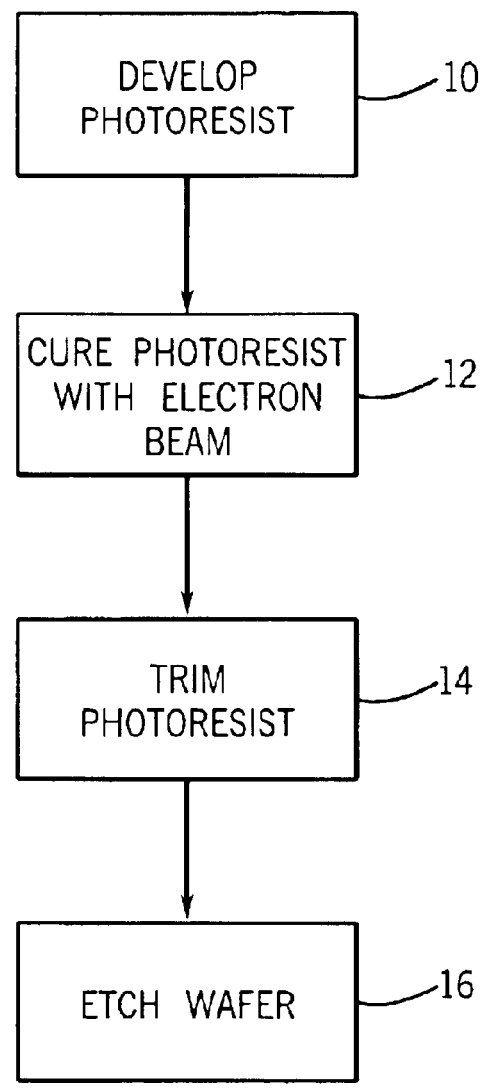
FIG. 1 is a flow diagram showing a process for enhancing the etch trimmability and etch stability of transistor gates patterned on a photoresist layer in accordance with an exemplary embodiment.

In one embodiment of the present invention, an advantageous process for enhancing the etch trimmability and stability of transistor gates patterned on a photoresist layer during an integrated circuit (IC) fabrication is provided. An exemplary embodiment of the present invention will be described with respect to a flow diagram shown in FIG. 1. The flow diagram includes a developing step 10, an electron beam curing or E-beam radiation exposure step 12, a resist trimming step 14, and an etching step 16.

Figure 2:
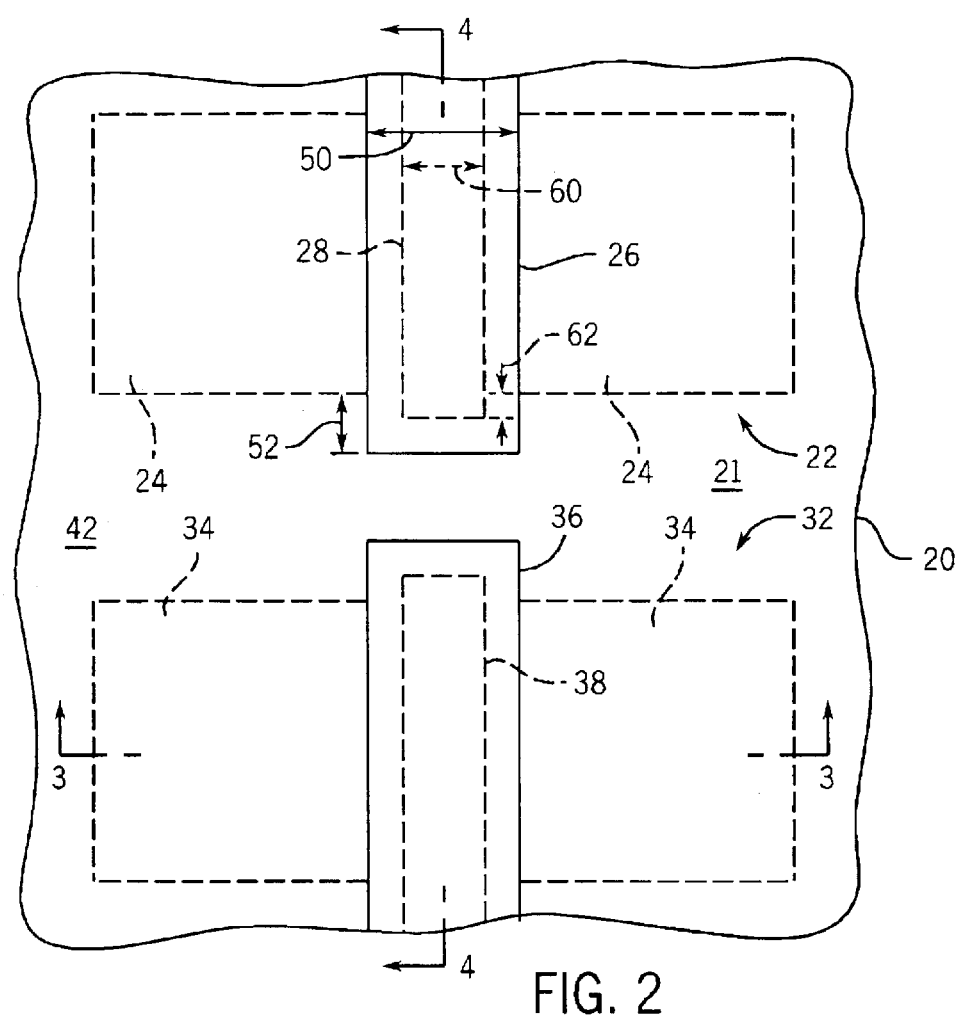
FIG. 2 is a top view of a portion of a wafer including transistors, showing a transistor gate pattern developed on a photoresist layer.
Figure 3:
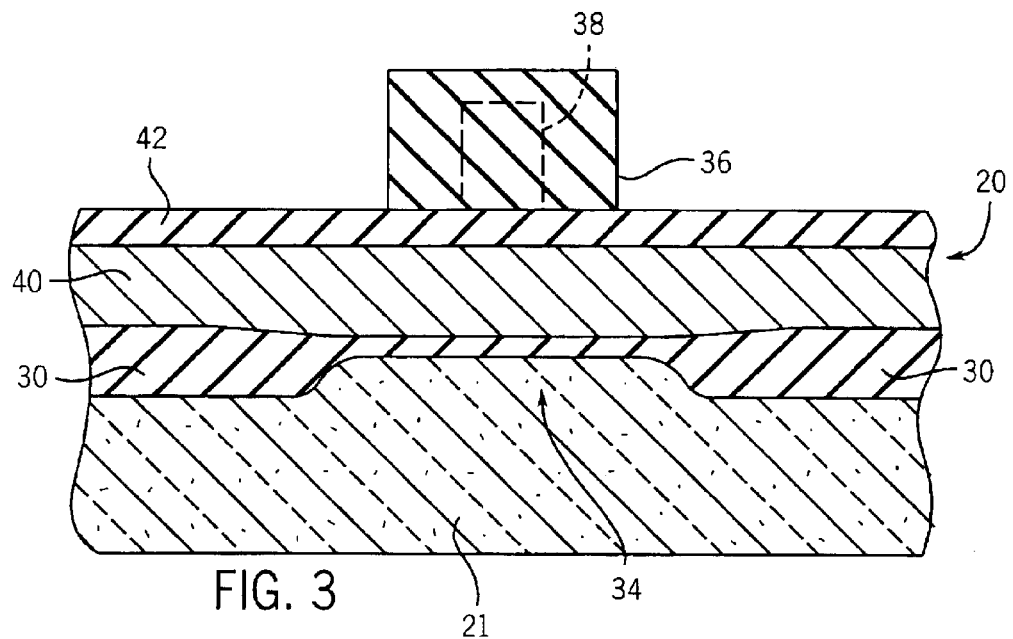
FIG. 3 is a cross-sectional view taken along line 3—3 of the wafer illustrated in FIG. 2.
Figure 4:
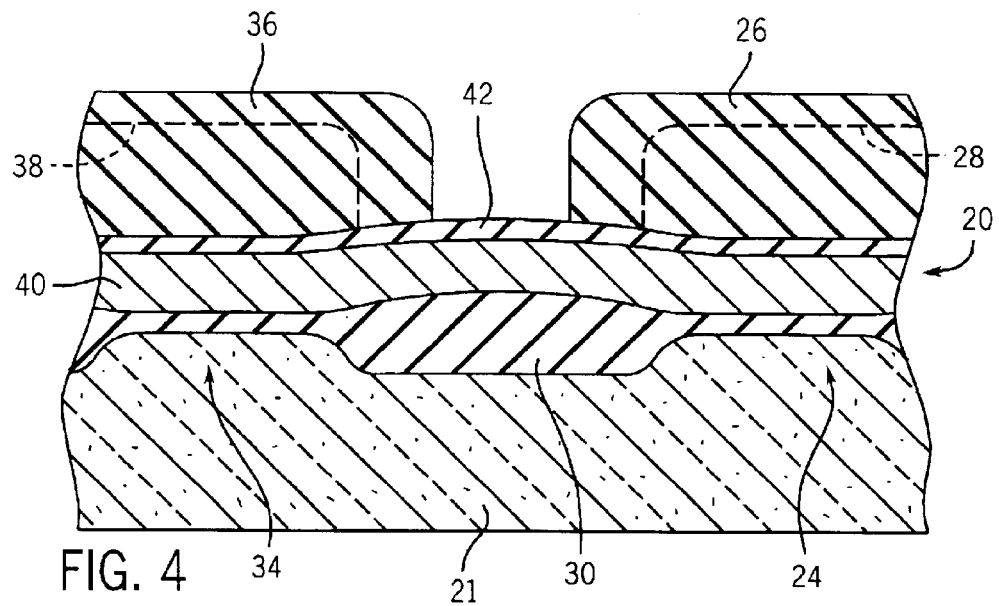
FIG. 4 is a cross-sectional view taken along line 4—4 of the wafer illustrated in FIG. 2.

In FIG. 2, a top planar view of a portion of a wafer 20 undergoing transistor fabrication is shown. In FIGS. 3-4, cross-sectional views of wafer 20 illustrated in FIG. 2, taken at lines 3—3 and 4—4, respectively, are shown. In FIGS. 3-4, wafer 20 includes a base layer or substrate 21, a first transistor 22, a second transistor 32, and isolation regions 30 (FIG. 3). First and second transistors 22, 32 are formed on substrate 21. First and second transistors 22, 32 are electrically isolated from each other by isolation regions 30. First and second transistors 22, 32 are similar to each other. Although not shown, wafer 20 can include more than two transistors on substrate 21.

Substrate 21 can comprise a single crystal material such as a single crystal silicon wafer. Alternatively, substrate 21 can be a bulk substrate, an epitaxial layer, a silicon-on-insulator (SOI) substrate, a gallium arsenide (GaAs) material, or other semi-conductive material. For purposes of illustration only, substrate 21 will hereinafter be discussed as an SOI substrate.

As shown in FIGS. 3-4, selective regions of substrate 21 (i.e., the top silicon layer on wafer 20) are etched and an insulator (e.g., an oxide insulator) is grown or deposited. The insulator can be used to form isolation or field regions 30. The oxide insulator can be a field oxide such as silicon dioxide, tetra-ethyl-ortho-silicate (TEOS), poly-silicon encapsulated in silicon dioxide or other insulator. Alternatively, isolation regions 30 can be shallow trench isolation (STI) structures. Also substrate 21 includes a first active region 24 of first transistor 22 and a second active region 34 of second transistor 32. The distance between adjacent isolation regions 30, as shown in FIG. 3., can be 160 nm for a typical technology having a 100 nm design rule dimension.

A polysilicon layer 40 is provided over first and second active regions 24, 34 and isolation regions 30. A bottom anti-reflective coating (BARC) layer 42 is provided over polysilicon layer 40, underneath the photoresist. Polysilicon layer 40 can comprise poly-silicon, amorphous silicon, metal or a stack of these materials typically having a thickness in the range of 200 nm or less. A dielectric or stack of dielectric materials serves as the gate insulator between the poly-silicon and the substrate. Polysilicon layer 40 can be formed by a diffusion furnace LPCVD process. ARC layer 42 can comprise stoichiometric silicon nitride (SiN), non-stoichiometric silicon nitride SixN (e.g., silicon-rich nitride where x>1), silicon oxynitride SixOyN, or one of a stack including these material and possibly over-layers or under-layers of oxide, with a thickness typically in the range of 10 nm to 80 nm. ARC layer 42 can be formed by a PECVD or LPCVD process or a sequence of these processes when the ARC consists of a stack of different films.

A photoresist layer is provided over ARC layer 42. The photoresist layer is exposed to a gate pattern for each transistor being fabricated in wafer 20, in accordance with a pattern provided on a mask or reticle and a photolithographic system. In developing step 10, the patterned photoresist layer is suitably developed to define, among others, a first gate photoresist feature 26 for first transistor 22 and a second gate photoresist feature 36 for second transistor 32.

The photoresist layer from which first and second gate patterns or features 26, 36 are defined can comprise a variety of photoresist materials suitable for lithographic applications. The material comprising the photoresist layer can include, among others, a matrix material or resin, a sensitizer or inhibitor, and a solvent, and is a chemically amplified, positive or negative tone, organic-based photoresist. The material comprising the photoresist layer may be, but is not limited to, an acrylate-based polymer, an alicyclic-based polymer, a phenolic-based polymer or polystyrene-based polymer. For example, the photoresist layer may comprise commercially available acrylate or polystyrene-base photoresist material. The photoresist layer is preferably spin coated over ARC layer 42. The photoresist layer is provided at a thickness of less than 1.0 μm.

First feature 26 is defined to be disposed over the central portion of first active region 24 with a certain amount of length extending into isolation regions 30. Similarly, second feature 36 is defined to be disposed over the central portion of second active region 34 with a certain amount of length extending into isolation regions 30. First feature 26 has a width 50 and a length extension 52 (e.g., an end of the line dimension). Second feature 36 is identical to first feature 26, and the discussion of width 50 and length extension 52 of first feature 26 is also applicable to second feature 36.

For example, when the photoresist layer is an ES-cap, acetal or other styrene based polymer exposed using 248 nm wavelength lithography, width 50 can be approximately 150 nm and length extension 52 can be approximately 100 nm. When the photoresist layer is an acrylate-based photoresist exposed using 193 nm lithography, width 50 can be approximately 110–130 nm and length extension 52 can be approximately 120 nm.

Generally, length extension 52 is not set by the resist type that is used. Length extension 52 can be set by a combination of the circuit layout rules governed by: 1. economic competitiveness which forces these layout rules to shrink according to design rules, 2. The amount of end-cap required to remain after etch to achieve a given transistor performance, and 3. the margin of the photo process. For example, the "as drawn" values of length extension 52 for 130 nm and 100 nm technologies can be 210 nm and 160 nm, respectively.

Generally, length extension 52 should have approximately 80 nm remaining after etching. Accordingly, during lithography extension 52 is dimensioned larger than an 80 nm end-cap during trim. However over-sizing extension 52 can interfere with the minimum spacing between line ends. That minimum is set by the design rules. Thus, with these restrictions, it is desirable to reduce the rate at which the end-cap is consumed during the etch process, which can be achieved with the advantageous process disclosed herein.

The various dimensions and materials given for the discussed structures, including BARC layer 42, polysilicon layer 40, and region 30 are not described in a limiting fashion. As discussed above, various design parameters and process criteria can cause the exemplary dimensions and materials to be changed without departing from the scope of the invention.

After developing step 10, but before first and second features 26, 36 are transferred onto any of the underlying layer(s) (layers 40 and 42 are etched), wafer 20 containing a pattern (resist features 26, 36) is exposed to a precisely controlled flood electron beam exposure (E-beam irradiation step 12). The flood electron beam impinges and penetrates the exposed first and second features 26, 36 and chemically modifies or transforms such exposed structures to affect the etch characteristics of first and second features 26, 36. In particular, a horizontal or trim etch rate, a vertical or erosion etch rate, and an erosion rate of a minimum extension onto isolation regions 30 of each of first and second features 26, 36 are affected to facilitate and control etching of first and second features 26, 36 in resist trimming step 14.

The electron beam is preferably emitted from an extended area electron source (not shown) and is a uniform collimated beam that is flood exposed over wafer 20. An example of an extended area electron source suitable to generate the electron beam is manufactured by Electron Vision Corporation of San Diego, Calif.

The electron beam flood exposure conditions or parameters (e.g., dose, accelerating voltage, and beam current) are selected to provide optimum desirable etch trimmability and etch stability characteristics to first and second features 26, 36 for resist trimming step 14. The electron beam exposure E-beam irradiation conditions can vary depending on the type of photoresist material, subsequent processing steps involving the E-beam irradiated photoresist, and/or desired characteristics of the photoresist material. An exemplary electron-beam cure recipe delivers a total electron dose (e.g., 2000 uC/cm2) in one or more steps having accelerating voltages from 50 to 2000V depending on the resist and application.

The photoresist material comprising first and second features 26, 36 is a 248 nm photoresist material (e.g., a polystyrene-based polymer) which typically exhibits a higher ratio of vertical to horizontal resist consumption rates, so substantial process latitude is present without the use of E-beam irradiation. The higher e-beam irradiation doses are required to obtain adequate e-beam induced cross linking of the polymer in order to realize the desirable trim etch enhancements. The acrylate and alicyclic-based resists have higher e-beam induced cross-linking efficiency. Thus, it is expected to require a higher dose at a given energy to achieve the same result in a 248 nm resist.

E-beam irradiation step 12 imparts a chemical change, i.e., cross-linking and decomposition, to the functional groups and additives in the regions of the photoresist material which are bombarded by the electron beam. Such regions of the photoresist material will accordingly have increased etch resistance (i.e., reduced etch rate), bulk modulus, bulk toughness, and interfacial toughness of the substrate-resist polymer bond (i.e., the bond between the photoresist layer and ARC layer 42). The cross-linked or e-beam irradiated regions can be the top portion, the top and side portions, or the entire feature of each of first and second features 26, 36. An exemplary electron-beam cure recipe delivers a total electron dose (e.g., 2000 uC/cm2) in one or more steps having accelerating voltages from 50 to 2000V depending on the resist and application.

The extent to which first and second features 26, 36 should be e-beam irradiated (e.g., the e-beam irradiated depth, E-beam irradiated region(s), and degree of decomposition of the functional groups of the photoresist material) depends on, among others, the extent to which the E-beam irradiated first and second features 26, 36 are trimmed in trimming step 14. The E-beam irradiated or penetration depth and E-beam irradiated region(s) of first and second features 26, 36 are related to the electron beam flood exposure conditions, processing gas(es), and or wafer temperature. The degree of decomposition of the functional groups of the photoresist material is related to the total electron dose electrons per unit area as well as to the doses and energies of the individual steps in the E-beam irradiation recipe sequence. There may be a dependence on substrate temperature as well.

After E-beam irradiation step 12, wafer 20 undergoes resist trimming step 14. Trimming step 14 is preferably a plasma etching step. Wafer 20 is exposed to a plasma etchant to trim or reduce the dimensions of features patterned on the photoresist layer, such as, first and second features 26, 36. The plasma etchant can comprise a variety of plasma etch chemistries, such as, $O_2$, $HBr/O_2$, $Cl_2/O_2$, $N_2/He/O_2$, or $N_2/O_2$. A variety of standard etching equipment, such as those manufactured by Applied Materials of Santa Clara, Calif., or Lam Research of Freemont, Calif., may be utilized to provide the plasma etchant. An exemplary trim/gate stack etch can employ HBr/O2/Ar chemistry for the resist trim, CF4/Ar chemistry for the ARC etch, and a sequence of steps employing one or more of HBr, HeO2, CF3, and Cl2 for the polysilicon etch.

The plasma etchant etches all exposed surfaces between first and second features 26, 36, including the top and side surfaces, to form first and second trimmed gate features 28, 38, respectively (shown in dotted lines in FIGS. 2-4).

Because different regions or portions of each of first and second features 26, 36 have different etch rates relative to each other following E-beam irradiation step 12 (e.g., vertical etch rate vs. horizontal etch rate), the dimensional reduction of all of the surfaces of first and second features 26, 36 is not the same.

Moreover, each of first and second trimmed features 28, 38 has uniformity in width along its length, has maintained a minimum extension onto isolation regions 30 (i.e., does not suffer from an end cap pull back problem), and sufficient thickness or vertical height remains for subsequent transfer of the pattern of features 28, 38 onto the underlying layer(s) of wafer 20.

For acrylate based photoresist material, width 50 of approximately 110–130 nm can be trimmed to a width 60 of approximately 20–60 nm. An extended length 62 (also referred to as an end cap) of first trimmed feature 28 onto isolation regions 30 can be on the order of a few tens of a nanometer. The variation in width 60 along the length of first trimmed feature 28 can be less than 1 nm. Second trimmed feature 38 is identical to first trimmed feature 28 and the above discussion is similarly applicable for second trimmed feature 38.

Figure 5:
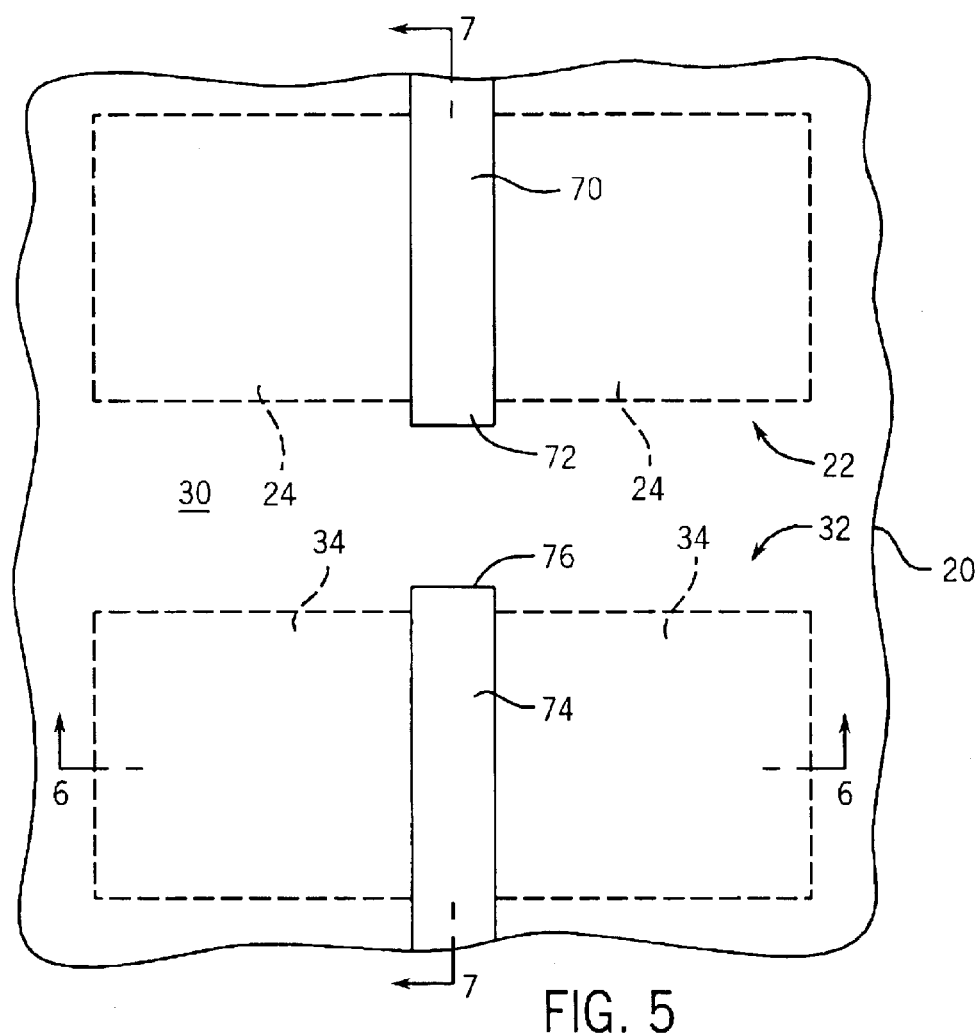
FIG. 5 is a top view of the wafer illustrated in FIG. 2, showing a gate etch process.
Figure 6:
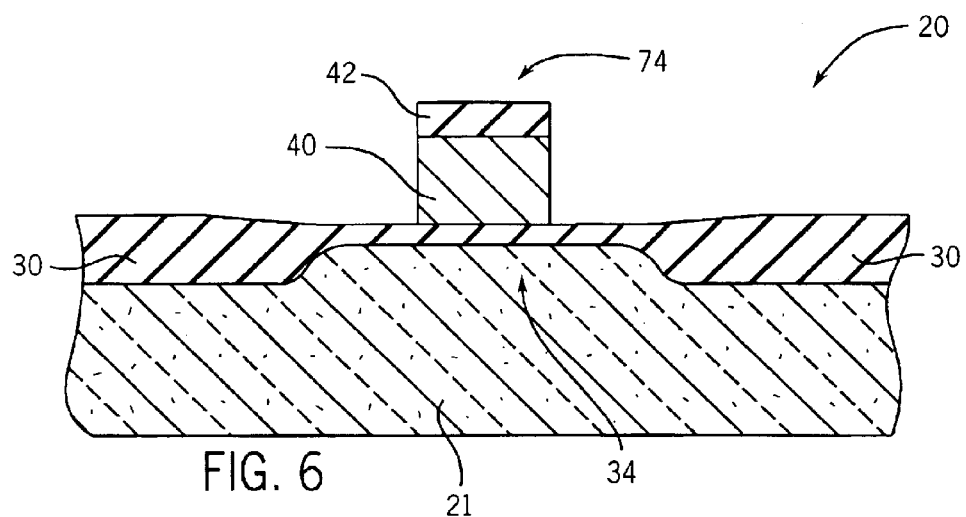
FIG. 6 is a cross-sectional view taken along line 6—6 of the wafer illustrated in FIG. 5.
Figure 7:
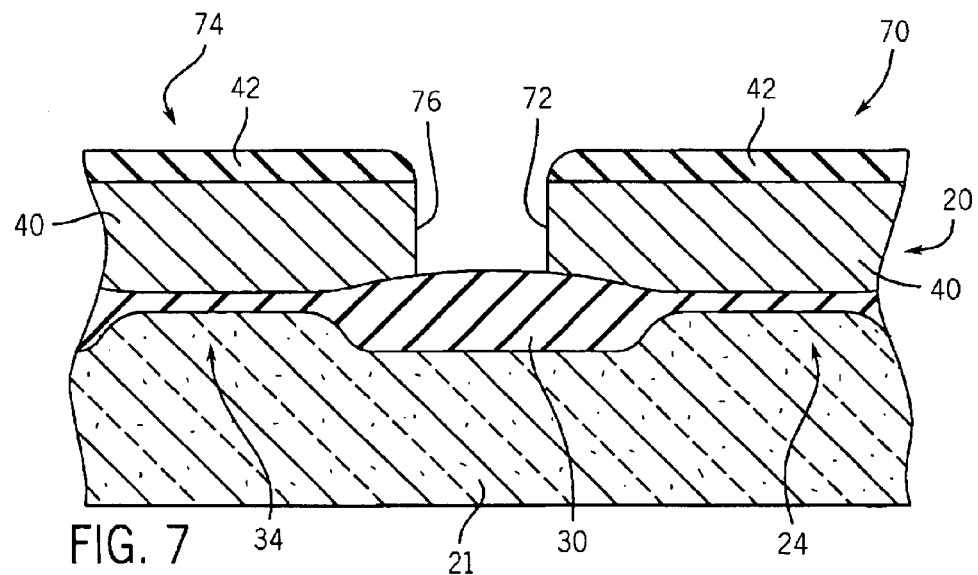
FIG. 7 is a cross-sectional view taken along line 7—7 of the wafer illustrated in FIG. 5.

After trimming step 14, wafer 20 undergoes etching step 16. As shown in FIGS. 5-7, polysilicon layer 40 and ARC layer 42 are etched in accordance with first and second trimmed feature 28, 38 to define a first gate 70 of first transistor 22 and a second gate 74 of second transistor 32, respectively.

Preferably, first and second gates 70, 74 have gate widths comparable to width 60. First gate 70 includes a minimum extension 72 onto isolation regions 30 and second gate 74 includes a minimum extension 76 onto isolation regions 30. Each of minimum extensions 72, 76 has a length comparable to extended length 62. The width along the length of each of first and second gates 70, 74 has a variation of less than 1 nm, as opposed to a gate formed from photoresist that was not e-beam irradiated which has a gate width variation along its length of approximately 5 nm. In one embodiment, the local gate width variation is between 4 to 6 nm over a 3 nm gate length (3 sigma). Preferably this variation can be further reduced as technology permits.

In this manner, transistors having narrow and uniform gate widths can be consistently fabricated. Because there is less consumption of the minimum extension of each gate onto the field isolation region (i.e., reduced rate of end-cap pull back during the resist trimming process), an increased number of transistors can be provided per unit area and the number of defective transistors is decreased. E-beam irradiation the gate feature patterned on the wafer with an electron beam after development but before the resist trimming process imparts desirable etch characteristics to such patterned features and even to photoresist materials that have inherently poor trim properties. Accordingly, after the E-beam irradiated gate features have been trimmed, the trimmed gate features enjoy several advantages, including higher uniformity in the gate widths or critical dimensions between gates, higher uniformity in the gate width or critical dimension along the length of a given gate, a narrower gate width, a reduction in consumption of the minimum extension of a given gate onto the field isolation region, and improved control and predictability during the trimming process, than is otherwise possible.

It is understood that although the detailed drawings, specific examples, and described the exemplary embodiments of the present invention, they are for purposes of illustration only. The exemplary embodiments of the present invention are not limited to the precise details and descriptions described herein. For example, although particular materials or chemistries are described, other materials or chemistries can be utilized. Various modifications may be made in the details disclosed without departing from the spirit of the invention as defined in the following claims.

What is claimed is:

1. An integrated circuit fabrication process, the process comprising the steps of:

patterning a transistor gate pattern on a photoresist layer;

curing the transistor gate pattern with an electron beam;

trimming the cured transistor gate pattern; and transferring the trimmed transistor gate pattern to a layer disposed below the trimmed pattern to form a transistor gate, wherein the transistor gate includes a width and a length, and a variation of the width along the length of the transistor gate is reduced due to the curing step.

2. The process of claim 1, wherein the photoresist layer is comprised of a photoresist material used for at least one of 248 nm lithography, 193 nm lithography, and extreme ultraviolet light (EUV) lithography.

3. The process of claim 2, wherein the photoresist layer is comprised of a photoresist material of a type used for 193 nm and 248 nm lithography and is commercially available.

4. The process of claim 1, wherein the final gate transistor width is in the range of approximately 20–60 nm.

5. The process of claim 1, wherein the curing step includes exposing the transistor gate pattern to the electron beam having a dose in the range of approximately 100–100000 $\mu C/cm^2$.

6. The process of claim 1, wherein the curing step includes exposing the transistor gate pattern to the electron beam having an accelerating voltage in the range of approximately 50–2000 Volts.

7. The process of claim 1, wherein the curing step includes changing at least one of a vertical etch rate, a horizontal etch rate, and a minimum extension erosion rate associated with the transistor gate pattern.

8. A method of forming a transistor having a gate width of less than 70 nm, the method comprising the steps of:

curing a gate pattern of a photoresist layer using E-beam irradiation;

trimming the cured E-beam irradiated gate pattern of the photoresist layer; and etching a polysilicon layer disposed below the photoresist layer in accordance with the trimmed gate pattern to form a gate of the transistor, the gate width being less than 70 nm, wherein a variation of the width along the length of the transistor gate is reduced due to the curing step.

9. The method of claim 8, wherein said E-beam irradiation uses an electron beam at a dose in the range of approximately 100–100000 $\mu C/cm^2$.

10. The method of claim 9, wherein the electron beam is provided at an accelerating voltage in the range of approximately 50–2000 Volts.

11. The method of claim 9, wherein a uniformity of the gate width is 4 to 6 nm over a 3 nm segment.

12. The method of claim 9, wherein the photoresist layer is comprised of a material selected from a group consisting of an acrylate-based polymer, alicyclic-based polymer, phenolic-based polymer, and a polystyrene-based polymer.

13. The method of claim 9, wherein the E-beam irradiation step includes affecting at least one of a vertical etch rate, a horizontal etch rate, and a minimum extension erosion rate associated with the gate pattern of the photoresist layer.

14. The method of claim 9, wherein said E-beam irradiation achieves an enhancement interim rate for a commercially available resists using lithography processes with either 248 nm and 193 nm wavelength of light.

15. A method of producing an integrated circuit comprising:

providing a photoresist material over a substrate;

curing a portion of the photoresist material by irradiating said portion of the photoresist material with an electron beam to form a gate pattern;

trimming the cured gate pattern; and etching the substrate in accordance with the gate pattern to form a gate, the gate having a width of less than 70 nm, wherein a variation of width along the length of the transistor gate is reduced due to the curing step.

16. The method of claim 15, wherein the electron beam is provided at an accelerating voltage in the range of approximately 0.5–50 Kv.

17. The method of claim 15, wherein the photoresist layer is comprised of a material selected from a group consisting of an acrylate-based polymer, an alicyclic-based polymer, a phenolic-based polymer, and a polystyrene-based polymer.

18. The method of claim 15, wherein the step of irradiating a portion of the photoresist material includes affecting at least one of a vertical etch rate, a horizontal etch rate, and a minimum extension erosion rate associated with the gate pattern of the photoresist layer.

19. The method of claim 15, wherein the step of irradiating a portion of the photoresist material achieves an enhancement interim rate for a photoresist material using lithography processes with either 248 nm and 193 nm wavelength of light.

20. The method of claim 15, wherein the photoresist material may be used with at least one of 248 nm lithography, 193 nm lithography, and extreme ultraviolet (EUV) lithography.

* * * * *